(12) United States Patent
Gigi (10) Patent No.: US 7,453,942 B2
(45) Date of Patent: Nov. 18, 2008

(54) METHOD AND UNIT FOR SUBSTRACTING QUANTIZATION NOISE FROM A PCM SIGNAL

(75) Inventor: Ercan Ferit Gigi, Eindhoven (NL)

(73) Assignee: NXP B.V., Eindhoven (NL)

( * ) Notice: Subject to any disclaimer, the term of this patent is extended or adjusted under 35 U.S.C. 154(b) by 485 days.

(21) Appl. No.: 10/502,282

(22) PCT Filed: Dec. 23, 2002

(86) PCT No.: PCT/IB02/05711

§ 371 (c)(1),
(2), (4) Date: Jul. 22, 2004

(87) PCT Pub. No.: WO03/063160

PCT Pub. Date: Jul. 31, 2003

(65) Prior Publication Data

US 2005/0117656 A1 Jun. 2, 2005

(30) Foreign Application Priority Data

Jan. 25, 2002 (EP) .................................. 02075312

(51) Int. Cl.
*H04B 14/06* (2006.01)
(52) U.S. Cl. ..................................................... 375/245
(58) Field of Classification Search ................. 375/242, 375/43, 45, 254
See application file for complete search history.

(56) References Cited

U.S. PATENT DOCUMENTS 5,636,295 A * 6/1997 Kim .......................... 382/251
5,774,842 A * 6/1998 Nishio et al. ................ 704/226

OTHER PUBLICATIONS

Yutaka Goto (hereinafter Yukata), "Effects of Noise on the Interpolation Accuracy for Apodized FFT Spectra of Time-Domain Damped signals", Department of Information Science and Electronics, Tsukuba College of Technology, Tsukaba-shi, Ibaraki, 305 Japan, vol. 49, No. 12, 1995.*

* cited by examiner

*Primary Examiner*—David C. Payne
*Assistant Examiner*—Leon Flores (57) ABSTRACT

A method and unit for substracting quantization noise from a pulse code modulated PCM signal being segmented into frames. For achieving this it is proposed to first calculate for each frame of the PCM signal a quantization noise level Bq according to an equation having parameters including n which indicates a specific sample of the PCM signal, $S^*_{min}[n]$ which represents the minimum quantization noise level for a specific sample value $s^*[n]$ of the PCM signal, $S^*_{max}[n]$ which represents the maximum quantization noise level for the specific sample value $s^*[n]$ of the PCM signal, w[n] which represents a window-function and W which represents the number of samples per window. Subsequently, the quantization noise as represented by the quantization noise level Bq has to be substracted from the PCM signal, preferably with the help of a suitable background noise substracting system.

$$B_q = \sqrt{\sum_{n=0}^{W-1} \frac{\{(s^*_{min}[n] - s^*_{max}[n]) \cdot w[n]\}^2}{12}} \quad (I)$$

16 Claims, 5 Drawing Sheets

METHOD AND UNIT FOR SUBSTRACTING QUANTIZATION NOISE FROM A PCM SIGNAL

The invention relates to a method and a unit for substracting quantization noise from a PCM signal.

Pulse code modulation (PCM) is a widely used technique to represent e.g. audio signals in the digital domain. Linear PCM uses evenly distributed quantization levels whereas the logarithmic PCM uses a distribution where small-signal amplitudes are quantized using more closely spaced levels than large-signal amplitudes. An example to linear PCM is the CD-audio, which uses 16 bits to represent uniformly distributed signal levels.

Figure 5:
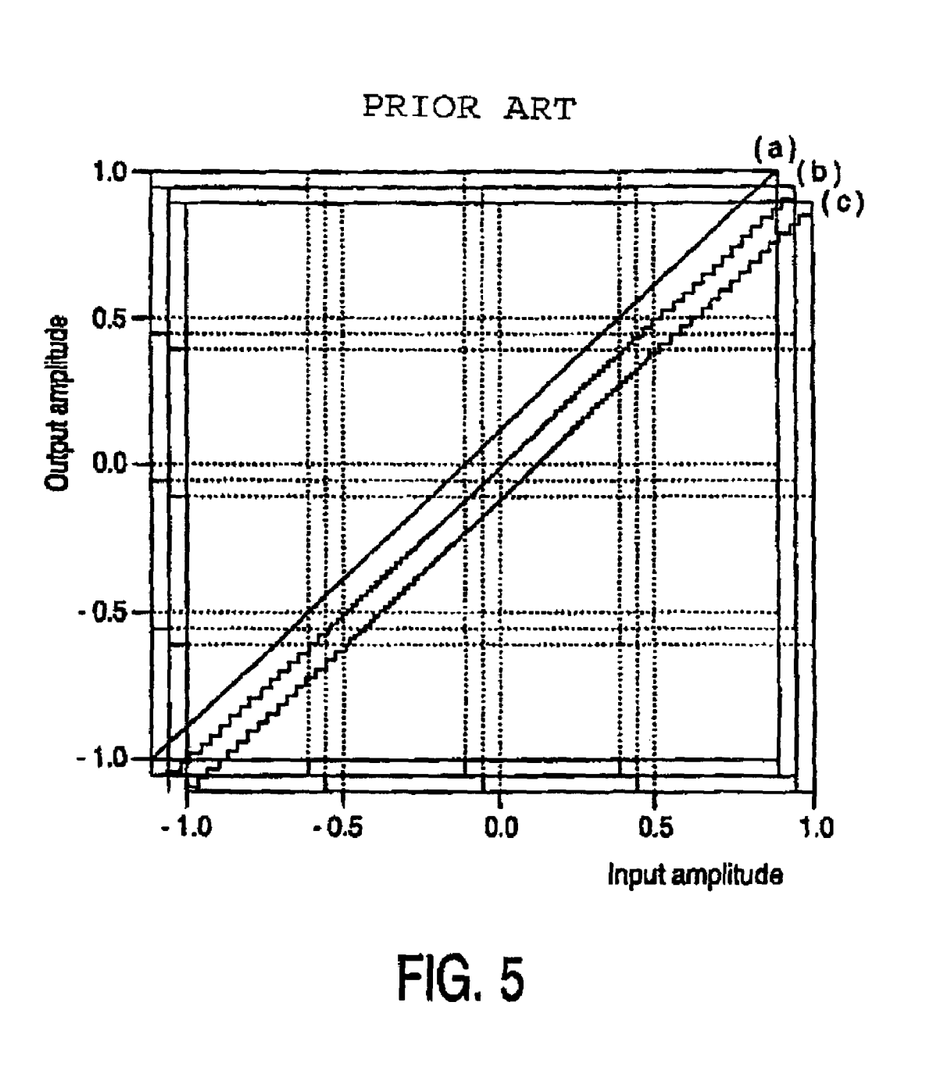
FIG. 5 showing quantization levels for linearly and non-linearly coded PCM-signals as known in the art.
Figure 41:
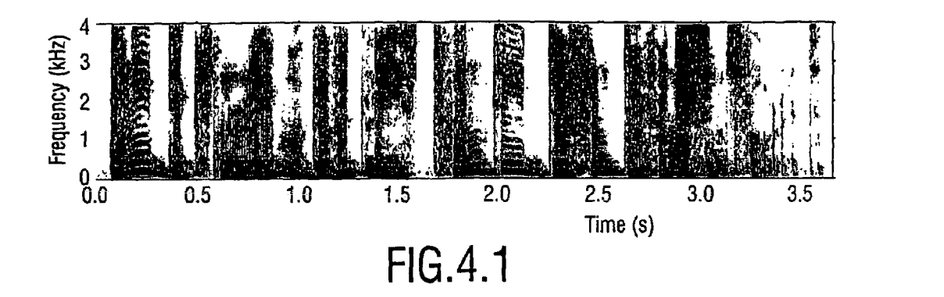
Figure 42:
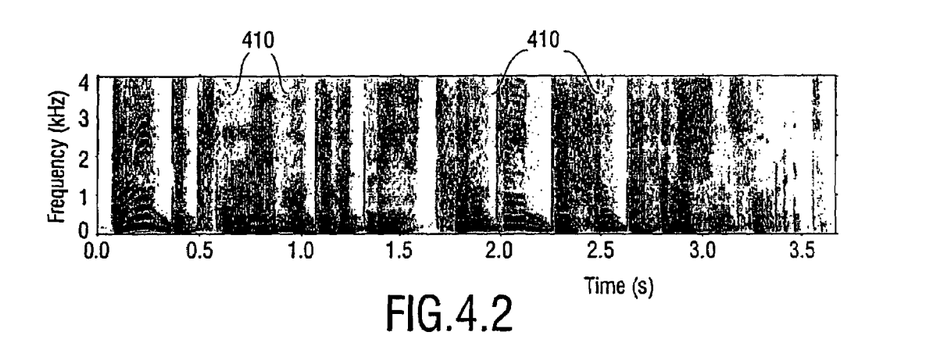
Figure 43:
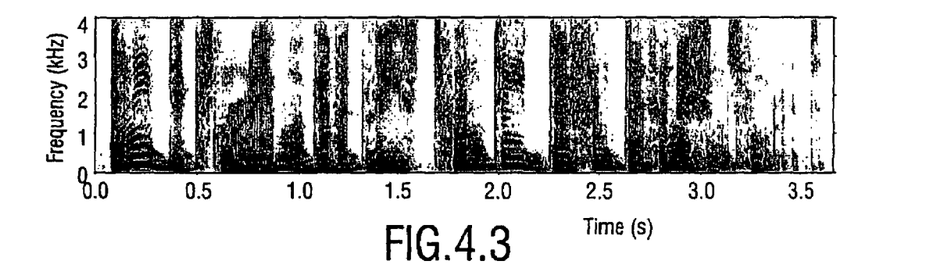
Figure 44:
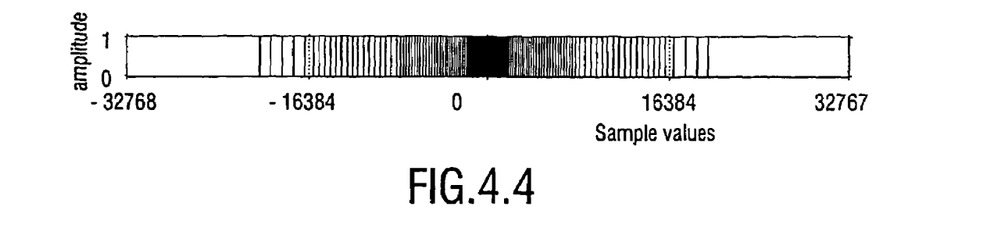

FIG. 5 illustrates the quantization of a linear coded PCM signal amplitudes (curve (a)) and of two logarithmically coded PCM signal amplitudes (curve (b) and (c)). Cuve b illustrates the quantization of claw coded PCM signal amplitudes, wherein the claw has an input-output magnitude characteristic of the form:

$$|y| = \frac{\log(1+\mu|s|)}{\log(1+\mu)}, \quad (1)$$

where |s| is the magnitude of the input, |y| is the magnitude of the output and $\mu$ is a parameter that is selected to give the desired compression characteristic.

In FIG. 5 curve c) illustrates the quantization of A-law coded PCM signal amplitudes, wherein the A-law has an input-output magnitude characteristic of the form:

$$|y| = \frac{1+\log A|s|}{1+\log A}, \quad (2)$$

wherein the meaning of y and s is as mentioned above and A is constant. The prior art µ-law and A-law coders are standardized by the Comité Consultatif International de Téléfonique et Télégraphique CCITT as the G.711 64 kbit/s PCM. The quantizer characteristics of the G.711 are disclosed in: N. S. Jayant and P. Noll, "Digital Coding of Waveforms", Englewood Cliffs N.J.: Prentice-Hall, 1984.

The quantized sample values of a signal may be modeled mathematically as $$s^*[n]=s[n]+q[n], \quad (3)$$

wherein S*[n] represents the quantized value of an original unquantized sample value s[n] and q[n] represents the quantization error resulting from said quantization. The quantization error can be interpreted as undesired additive noise decreasing the quality of the original sample values s[n].

Thus, it is the object of the invention to provide a method and a unit for substracting said quantization noise from a PCM signal.

This object is solved by a method comprising the steps of: calculating for each frame of said PCM signal a quantization noise level Bq according to the following equation:

$$B_q = \sqrt{\sum_{n=0}^{W-1} \frac{\{(s^*_{\min}[n] - s^*_{\max}[n]) \cdot w[n]\}^2}{12}}$$

wherein n: indicates a specific sample of the PCM signal;

$S^*_{min}[n]$: represents the minimum quantization noise level for a specific sample value s*[n] of said PCM signal;

$S^*_{max}[n]$: represents the maximum quantization noise level for the specific sample value s*[n] of the PCM signal;

w[n]: represents a window-function; and

W: represents the number of samples per window;

and substracting the quantization noise as represented by said quantization noise level Bq from said PCM signal.

It is the essential idea of the invention to calculate said quantization noise levels Bq for each frame according to the claimed formula and to use any suitable (background) noise substracting method known in the art—perhaps after carrying out slight modifications—to substract the quantization noise from the PCM signal.

Throughout the whole description * indicates the content of quantization noise n the co-ordinated quantity or signal.

The window-function may be chosen arbitrarily

The claimed formula requires the minimum quantization level $S^*_{min}[n]$ as well as on the maximum quantization level $S^*_{max}[n]$ of the sample values s*[n] of the PCM signal.

According to a first advantageous embodiment of the invention the minimum quantization level $S^*_{min}[n]$ as well as the maximum quantization level $S^*_{max}[n]$ are known from the quantization method applied for generating the PCM signal.

According to a second embodiment said quantization levels $S^*_{min}[n]$ and $S^*_{max}[n]$ are not known and must therefore be predicted according to the formulas claimed in claim 3.

Advantageously neither in the first nor in the second embodiment any additional information must transmitted together with the PCM sample values s*[n] to enable the conduction of the claimed method. This is because in the first embodiment the quantization levels and in the second embodiment reference levels i can be assumed to be known (see the last two paragraphs above) when the method for substracting the quantization noise according to the invention is carried out. Because of that advantageously bandwidth is saved.

Preferably, the noise substraction is based on a background noise substracting method and system as described in the non-prepublished European Patent application having the application number EP 01201304.1 of the same applicant. The application of said system is described later as preferred embodiment. The whole content of said patent application shall be regarded as part of the disclosure of the present application.

Finally, the above-identified object is solved by a noise substracting unit according to the subject matter of claim 9. The advantages of said unit correspond to the advantages mentioned above referring to the claimed method.

Preferably, the claimed unit and method are applied at the decoder side, i.e. just before the PCM signal is decoded again. However, nevertheless it might also be applied at the encoder side.

The description is accompanied by five figures, wherein

FIG. 4.1. shows the spectrum of a clean male voice;

FIG. 4.2. shows the μ-law coded version of the spectrum shown in FIG. 4.1.;

FIG. 4.3. shows the μ-law coded version of the spectrum shown in FIG. 4.1. after quantization noise substraction according to the invention;

FIG. 4.4. shows the usage array u[i] generated for applying the quantization noise substraction method to the spectrum shown in FIG. 4.2;

In the following a preferred embodiment of the invention will be described by referring to FIGS. 1-4.

Figure 1:
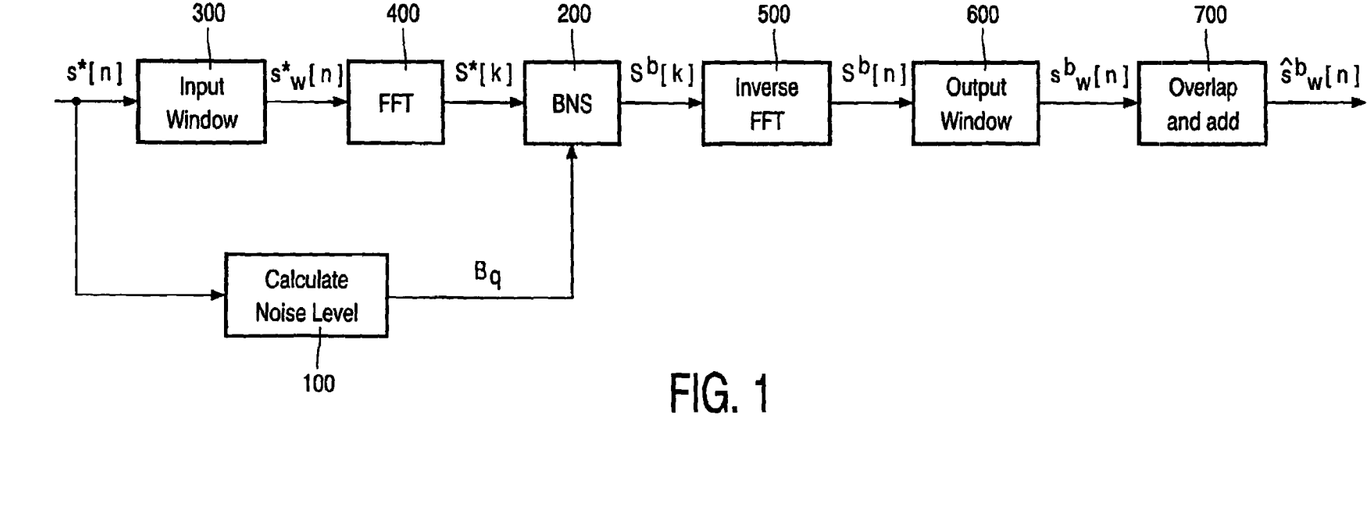
FIG. 1 shows a quantization noise substracting unit according to the invention including the background noise subtracting unit.

FIG. 1 shows a quantization noise substracting unit 100-700 for substracting quantization noise from an input linearly or logarithmically coded PCM signal.

First of all said unit comprises a quantization noise level calculating unit 100 for calculating a quantization noise level Bq for each frame of said PCM signal under consideration of both a minimum and a maximum quantization noise level $S^*_{min}[n]$, $S^*_{max}[n]$. More specifically, the quantization noise level Bq is constant for each frame of said PCM signal and calculated individually for a specific frame according to the following equation:

$$B_q = \sqrt{\sum_{n=0}^{W-1} \frac{\{(s^*_{min}[n] - s^*_{max}[n]) \cdot w[n]\}^2}{12}}$$

wherein n: indicates a specific sample of the PCM signal;

$S^*_{min}[n]$: represents the minimum quantization noise level for a specific sample value s*[n] of said PCM signal;

$S^*_{max}[n]$: represents the maximum quantization noise level for the specific sample value s*[n] of the PCM signal;

w[n]: represents a window-function; and

W: represents the number of samples per window comprising at least the specific frame for which Bq is currently calculated.

Typically, the number of samples per window is twice the number of samples per frame.

In equation 4 the term $$\frac{\{(s^*_{min}[n] - s^*_{max}[n]) \cdot w[n]\}^2}{12} = \varepsilon$$

represents the mean square value of the quantization error, i.e. the energy of the quantization noise in the current frame.

The frame size is typically 2 ms.

According to a first embodiment said quantization noise levels $S^*_{min}[n]$, $S^*_{max}[n]$ are assumed to be known.

However, according to a second embodiment of the invention these quantization levels $S^*_{min}[n]$, $S^*_{max}[n]$ are not assumed to be known, e.g. because the original signals might have been quantized with different quantizers and there may have been extra scalings applied on the samples before or after coding. In these cases the quantization levels have to be predicted.

To predict the quantization levels, the entire original signal, hereinafter also referred to as waveform, is scanned to receive the sample values s*[n] of the quantized waveform. Subsequently, a check is made, if all possible representation levels i predefined due the quantization method applied to the waveform are represented (used) by at least one said sample values s*[n]. For a 16-bit linear PCM quantization method there are $2^{16}=65536$ possible representation levels i and the result of said check is described in a so called usage table u[i] with 65536 values. The values of said usage table u[i] are either 1 (if there is at least one sample value of the whole waveform corresponding to the current representation level i) or 0 (if there is no sample value of the whole waveform corresponding to the current representation level i). Expressed mathematically $$u(i) = \min\left(1, \sum_{n=0}^{L-1} \begin{cases} 0, & s^*[n] \neq i \\ 1, & \text{otherwise} \end{cases}\right), -2^{N-1} \leq i < 2^{N-1} \quad (5)$$

In formula (5) L is the waveform length, i.e. the number of samples of the whole waveform, and N is the number of bits used by the linear PCM quantization; in the above example N=16. This operation can be simplified by initializing all values of u[i] with 0 and using formula (6):

$$u[s^*[n]] = 1, 0 \leq n < L \quad (6)$$

Now equations (5) or (6) are used to find special representation levels $i_{min}[n]$ and $i_{max}[n]$ required for predicting the desired quantization levels. More specifically, $i_{min}[n]$ is defined as that representation level which is—startet from i[n]—the next smaller non-zero representation level for which u[n]=1 and $i_{max}[n]$ is defined as that representation level which is—started from i[n]—the next bigger non-zero representation level for which u[n]=1.

With the help of said co-ordinated representation levels the desired quantization levels are predicted or calculated according to the following equations:

$$s^*_{min} = i[n] - (i[n] - i_{min}[n])/2 \quad (7)$$

$$S^*_{max} = i[n] + (i_{max}[n] - i[n])/2 \quad (8)$$

wherein i: represents one out of a plurality of predefined possible representation levels;

i[n]: represents that predefined representation level which corresponds to the sample value s*[n].

Figure 2:
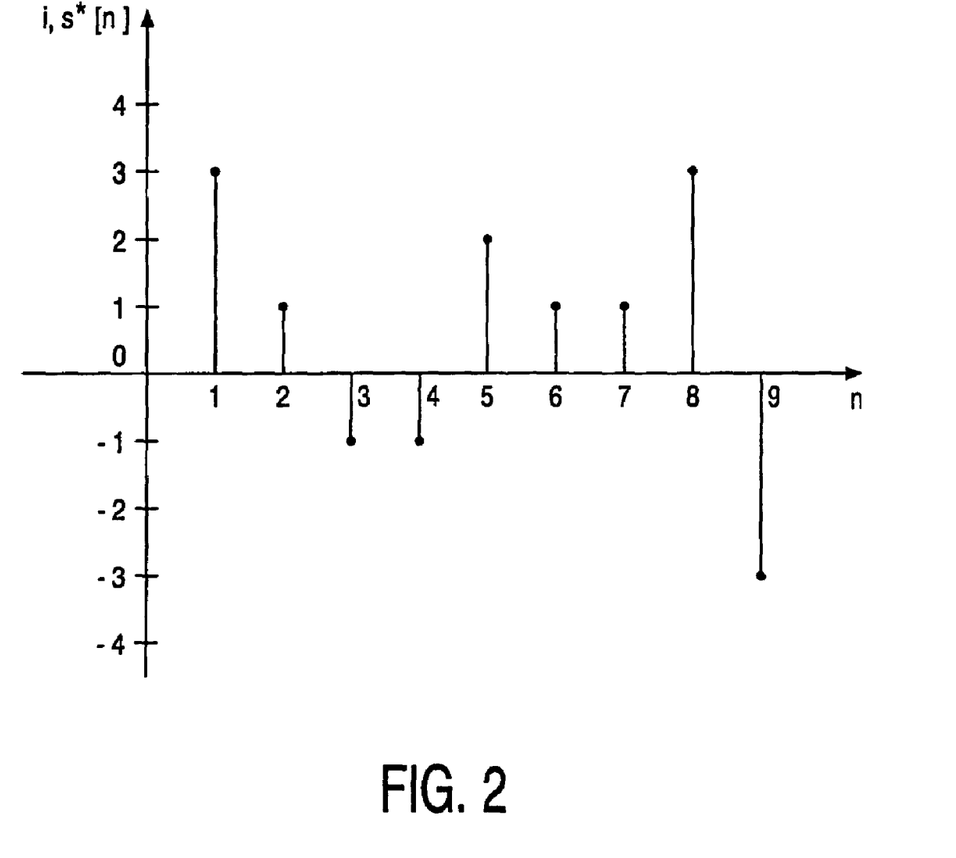
FIG. 2 shows an example for illustrating the correlation between reference values I and sample values S*[n]

FIG. 2 illustrates the calculation of the usage array, of said special representation levels $i_{min}[n]$, $i_{max}[n]$ and of the desired quantization levels $S^*_{min}[n]$, $S^*_{max}[n]$ for a given waveform consisting of L=9 sample values S*[n] which are in the example distributed as shown in Tab. 1:

TABLE 1

| n | 1 | 2 | 3 | 4 | 5 | 6 | 7 | 8 | 9 |
|---|---|---|---|---|---|---|---|---|---|
| s*[n] = i[n] | 3 | 1 | −1 | −1 | 2 | 1 | 1 | 3 | −3 |

In FIG. 2 there are provided 8 different possible representation levels i=−4, . . . −1, 0, 1, . . . , 3 resulting from a N=3 bit linear PCM quantization. The usage array u[i] calculated according to equation (5) or (6) for the example of Tab. 1 is:

$$u[-3]=u[-1]=u[1]=u[2]=u[3]=1; \text{ and}$$

$$u[-4]=u[-2]=u[0]=0$$

Now, from said usage array the reference levels $i_{min}[n]$ and $i_{max}[n]$ are calculated e.g. for n=2 with s*[2]=i[2]=1—according to the definition given above—to:

$$i_{max}[2]=2 \text{ and } i_{min}[2]=-1$$

and the desired quantization levels result—according to equations (7) and (8) to:

$$s^*_{min}=1-(1-(-1))/2=0$$

$$S^*_{max}=1+(2-1)/2=1,5$$

Special care has to be taken when i[n] co-ordinated to s*[n] is the first or last non-zero value in the usage-array u. One option is to allocate two extra array values $u[-2^{N-1}-]$ and $u[2^{N-1}]$, set them both to 1 and always continue the search until a non-zero value is found.

Another question is what to do when some valid quantization levels aren't used in the waveform. Especially waveforms shorter than 1 second will result in a usage-array with many unused (but valid) quantization levels. Since this usually will give a wrong result for the quantization step-size at boundaries (when the waveform is at its maximum or minimum value), the effect on the measured level of quantization noise will be small. Although an algorithm could be used to predict the unused valid quantization levels, the added value of the extra complexity is not worth the performance gain. In practice, it seems to be enough to assume that the used signal levels in the waveform are the only valid levels.

After the quantization noise level Bq has been calculated either with the known or with the predicted quantization levels $s^*_{min}$ and $s^*_{max}$ it is input into a background noise substracting unit BNS 200 which is also part of said quantization noise substracting unit.

Figure 3:
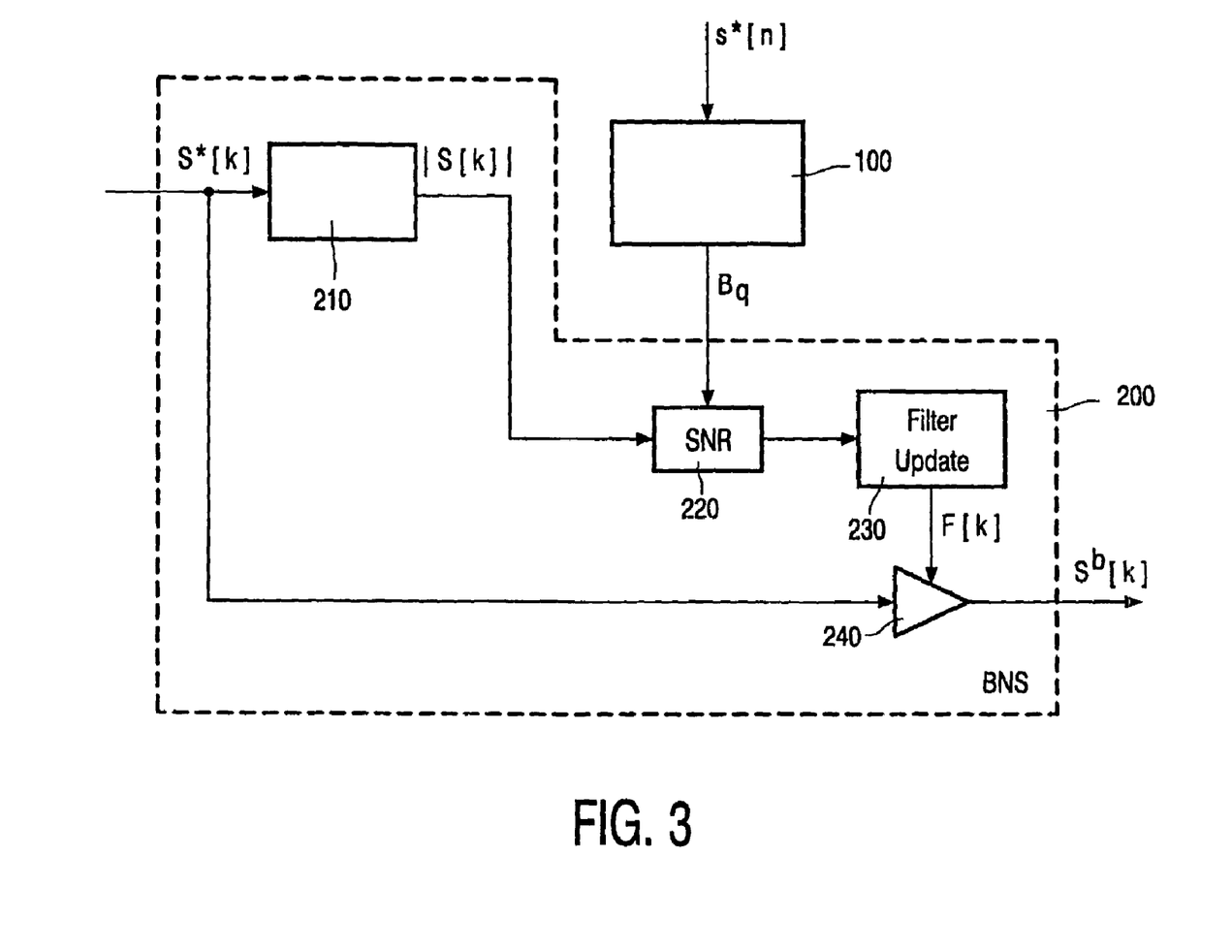
FIG. 3 shoes a detailed illustration of a background noise substracting unit.

FIG. 3 shows a detailed illustration of said background noise substracting unit 200 which is embodied to substract the quantization noise from a PCM signal in the frequency domain. It comprises a magnitude forming unit 210 for forming the magnitude |S*[k]| of the spectrum S*[k] of the PCM signal, a signal-to-noise ratio calculating unit 220 for calculating the signal-to-noise ratio of the PCM signal according to the formula:

$$SNR[k]=|S^*[k]|/Bq, \qquad (9)$$

wherein Bq is noise level representing the level of quantization noise in said PCM signal.

Said signal-to-noise ratio SNR[k] is input into a filter update unit 230 for calculating a filter magnitude F[k] according to a predefined filter algorithm based on at least one filter update parameter. Said filter magnitude F[k] is input into a calculation unit 240 for calculating an output spectrum $S^b[k]$ by multiplying both the real part R{S*[k]} and the imaginary part I{S*[k]} of the spectrum S*[k] with said filter magnitude F{k}. The filter update parameter and thus also the filter magnitude F[k] are preferably adjusted such that output spectrum $S^b[k]$ is at least substantially free of quantization noise.

Because said background noise substracting unit 200 is embodied to carry out the substraction of the quantization noise in the frequency domain, the quantization noise substracting unit further comprises several units for computing the spectrum S*[k] of the PCM signal to be input into said background noise substracting unit 200 and for transforming the spectrum $S^b[k]$ output by said unit 200 back into a time domain signal. These units are described in the following paragraphs.

Referring back to FIG. 1 the quantization noise substracting unit further comprises a first window block 300 for generating a weighted PCM signal $s^*_w[n]$ by weighting the frames of the input PCM signal with a first window w1[n]. Said weighted PCM signal $s^*_w[n]$ is input into a spectrum computing unit 400 for computing the spectrum S*[k] from said weighted signal. Preferably, the spectrum is computed by using the Fast Fourier Transformation algorithm. The spectrum S*[k] is than input into the background noise substracting unit 200 and processed therein as described above by referring to FIG. 3.

The spectrum $S^b[k]$ output by said background substracting unit 200 is input into a re-transforming unit 500 for being transformed back into a signal $s^b[n]$ in the time domain. In the case that the spectrum S*[k] has been calculated by using FFT the re-transformation is done by using the inverse FFT.

The quantization noise substracting unit may further comprise a second window block 600 for generating a weighted output signal $s^b_w[n]$ by weighting the signal $s^b[n]$ received after the transformation with a second window W2[n] and an overlap and add unit 700 for individually calculating a final output signal $\hat{S}^b_w[n]$ for each frame of the PCM-signal from said weighted output signal $s^b_w[n]$ such that the transition between two successive output frames is smoothed. The first and the second window W1 and W2 are preferably identical. They are independent of the window-function w[n] used for calculating the quantization noise level Bq. However, it is preferred to use the same function for w[n] as for W1.

The provision of the overlap and add unit 700 only improves the quality of the output signal but it is not absolutely necessary for carrying out the quantization noise substraction; consequently, it might be left out. The same applies to the first and the second window block 300 and 600 which are both only provided to improve the operation said overlap and add unit 700.

FIG. 4 shows an example illustrating the good signal quality achieved when applying the claimed method to a μ-law coded speech signal.

More specifically, FIG. 4.1 shows the spectrum of a clean, i.e. free of quantization noise, male voice recording with the utterance: "Any dictionary will give at least twenty different definitions for it". FIG. 4.2. shows the μ-law coded version of the spectrum shown in FIG. 4.1. From that FIG. 4.2. it can be seen that said μ-law coding causes quantization noise added to the clean spectrum of FIG. 4.1. In FIG. 4.2. the quantization noise is represented by the grey-shaded areas 410; the corresponding areas in FIG. 4.1 are clean. FIG. 4.3. shows the spectrum from FIG. 4.2 after the quantization noise substracting method according to the invention has been applied. It can been seen that this spectrum substantially corresponds to original clean spectrum shown in FIG. 4.1; that means that the method according to the invention is well able to clean the spectrum of a PCM signal from quantization noise. FIG. 4.4 shows the usage array u[i] as generated by the method according to the present invention for reducing quantization noise from the spectrum shown in FIG. 4.2.

What is claimed is:

1. A method for substracting quantization noise from a pulse code modulated PCM signal being segmented into frames, comprising the steps of:

calculating for each frame of said PCM signal a constant quantization noise level Bq according to the following equation:

$$B_q = \sqrt{\sum_{n=0}^{W-1} \frac{\{(s^*_{\min}[n] - s^*_{\max}[n]) \cdot w[n]\}^2}{12}}$$

wherein n: indicates a specific sample of the PCM signal; $S^*_{min}{}^{[n]}$: represents the minimum quantization noise level for a specific sample value s*[n] of said PCM signal; $S^*_{max}{}^{[n]}$: represents the maximum quantization noise level for the specific sample value s*[n] of the PCM signal, wherein $S^*_{min}{}^{[n]} - S^*_{max}{}^{[n]}$ has a different value for at least two specific samples n respectively;

w[n]: represents a window-function; and

W: represents the number of samples per window; and substracting the quantization noise as represented by said quantization noise level Bq from said PCM signal.

2. The method according to claim 1, characterized in that the minimum quantization level $S^*_{min}$ as well as the maximum quantization level $S^*_{max}$ are known.

3. The method according to claim 1, characterized in that the minimum quantization level $S^*_{min}$ and the maximum quantization level $S^*_{max}$ are predicted according to the following equations:

$$S^*_{min} = i[n] - (i[n] - i_{min}[n])/2$$

$$S^*_{max} = i[n] + (i_{max}[n] - i[n])/2$$

wherein i: represents one out of a plurality of possible representation levels predefined due to the specific PCM quantization method applied to an original signal;

i[n]: represents that predefined representation level which corresponds to the sample value s*[n] for a specific n;

$i_{min}[n]$: represents that representation level which is—started from i[n]—the next smaller non-zero representation level for which u[n]=1;

$i_{max}[n]$: represents that representation level which is—started from i[n]—the next bigger non-zero representation level for which u[n]=1;

with the usage array u[i] being defined to:

$$u(i) = \min\left(1, \sum_{n=0}^{L-1} \begin{Bmatrix} 0, & s^*[n] \neq i \\ 1, & \text{otherwise} \end{Bmatrix}\right), -2^{N-1} \leq i < 2^{N-1}$$

wherein

L: represents the number samples of the whole PCM-signal; and

N: represents the number of bits used for quantizing an original sample value by using PCM to generate the PCM sample values s*[n].

4. The method according to claim 1, characterized in that the substracting of the quantization noise represented by said quantization noise level Bq from the PCM-signal is carried out in the frequency domain according to the following steps:

computing the spectrum S*[k] of the PCM signal s*[n] and forming the magnitude |S*[k]| thereof;

computing a signal-to-noise ratio SNR[k] of said spectrum S*[k] according to:

$$SNR[k] = |S^*[k]|/Bq;$$

calculating from said signal-to-noise ratio SNR[k] a filter magnitude F[k] according to a predefined filter algorithm based on at least one filter update parameter;

calculating an output spectrum $S^b[k]$ at least substantially free of said quantization noise by multiplying both the real part R{S*[k]} and the imaginary part I{S*[k]} of the spectrum S*[k] with said filter magnitude F{k}; and transforming the output spectrum $S^b[k]$ back into a signal $s^b[n]$ in the time domain.

5. The method according to claim 4, characterized in that the filter update parameter and thus the filter magnitude F[k] are adjusted such that the quantization noise in the remaining output spectrum $S^b[k]$ is as low as possible.

6. The method according to claim 4, characterized in that it further comprises the steps of:

weighting the frames of the input PCM signal with a first window w1[n] and calculating the spectrum S*[k] from said weighted signal;

generating a weighted output signal $s^b_w[n]$ by weighting the signal $s^b[n]$ received after the re-transformation with a second window W2[n]; and calculating a final output signal $S_w{}^b[n]$ for a current frame of the PCM-signal from said weighted output signal $s^b_w[n]$ such that the transition between two successive output frames and is smoothed.

7. The method according to claim 4, characterized in that the computation of the spectrum S*[k] of the PCM signal is done by using a Fast Fourier Transformation FFT; and the re-transforming the output spectrum $S^b[k]$ back into a time domain signal $s^b[n]$ is done by using an inverse FFT.

8. The method according to claim 6, characterized in that the first and the second window w1 and w2 are identical.

9. A quantization noise substracting unit for substracting quantization noise from a pulse code modulated PCM signal being segmented into frames, comprising:

a quantization noise level calculating unit (100) for calculating for each frame of said PCM signal a constant quantization noise level Bq according to the following equation:

$$B_q = \sqrt{\sum_{n=0}^{W-1} \frac{\{(s^*_{\min}[n] - s^*_{(3)\max}[n]) \cdot w[n]\}^2}{12}}$$

wherein n: indicates a specific sample of the PCM signal;

$S^*_{min}[n]$: represents the minimum quantization noise level for a specific sample value s*[n] of said PCM signal;

$S^*_{max}[n]$: represents the maximum quantization noise level for the specific sample value s*[n] of the PCM signal, wherein $S^{*}_{min}{}^{[n]}-S^{*}_{max}{}^{[n]}$ has a different value for at least two specific samples n respectively;

w[n]: represents a window-function; and

W: represents the number of samples per window; and a background noise substracting unit for subtracting the quantization noise as represented by said quantization noise level Bq from said PCM signal.

10. The noise substracting unit according to claim 9, characterized in that it is located at a decoder's side.

11. The noise subtracting unit according to claim 9, characterized in that the minimum quantization level $S^{*}_{min}$ and the maximum quantization level $S^{*}_{max}$ are predicted according to the following equations:

$$S^{*}_{min}=i[n]-(i[n]-i_{min}[n])/2$$

$$S^{*}_{max}=i[n]+(i_{max}[n]-i[n])-/2$$

wherein i: represents one out of a plurality of possible representation levels predefined due to the specific PCM quantization method applied to an original signal;

i[n]: represents that predefined representation level which corresponds to the sample value s*[n]for a specific n;

$i_{min}[n]$: represents that representation level which is—started from i[n]—the next smaller non-zero representation level for which u[n]=1;

$i_{max}[n]$: represents that representation level which is—started from i[n]—the next bigger non-zero representation level for which u[n]=1;

with the usage array u[i]being defined to:

$$u(i) = \min\left(1, \sum_{n=0}^{L-1} \begin{Bmatrix} 0, & s^{*}[n] \neq i \\ 1, & \text{otherwise} \end{Bmatrix}\right), -2^{N-1} \leq i < 2^{N-1}$$

wherein

L: represents the number of samples of the whole PCM-signal; and

N: represents the number of bits used for quantizing an original sample value by using PCM to generate the PCM sample values s*[n].

12. The noise subtracting unit according to claim 9, characterized in that the background subtracting unit subtracts the quantization noise represented by said quantization noise level Bq from the PCM-signal in the frequency domain according to the following steps:

computing the spectrum S*[k] of the PCM signal s*[n] and forming the magnitude |S*[k]| thereof computing a signal-to-noise ratio SNR[k] of said spectrum S*[k] according to:

$$SNR[k]=|S^{*}[k]|/Bq;$$

calculating from said signal-to-noise ratio SNR[k] a filter magnitude F[k] according to a predefined filter algorithm based on at least one filter update parameter;

calculating an output spectrum $S^{b}[k]$ at least substantially free of said quantization noise by multiplying both the real part R{S*[k]} and the imaginary part I{S*[k]} of the spectrum S*[k] with said filter magnitude F{k}; and transforming the output spectrum $S^{b}[k]$ back into a signal $s^{b}[n]$ in the time domain.

13. The noise subtracting unit according to claim 12, characterized in that the filter update parameter and thus the filter magnitude F[k] are adjusted such that the quantization noise in the remaining output spectrum $S^{b}[k]$ is as low as possible.

14. The noise subtracting unit according to claim 12, characterized in that the background subtracting unit subtracting the quantization noise represented by said quantization noise level Bq from the PCM-signal in the frequency domain further comprises the steps of:

weighting the frames of the input PCM signal with a first window w1[n] and calculating the spectrum S*[k] from said weighted signal;

generating a weighted output signal $s^{b}_{w}[n]$ by weighting the signal $s^{b}[n]$ received after the re-transformation with a second window W2[n]; and calculating a final output signal $S^{b}_{w}[n]$ for a current frame of the PCM-signal from said weighted output signal $s^{b}_{w}[n]$ such that the transition between two successive output frames is smoothed.

15. The noise subtracting unit according to claim 12, characterized in that the computation of the spectrum S*[k] of the PCM signal is done by using a Fast Fourier Transformation FFT; and the transforming of the output spectrum $S^{b}[k]$ back into the time domain signal $s^{b}[n]$ is done by using an inverse FFT.

16. The noise subtracting unit according to claim 14, characterized in that the first and the second window w1 and w2 are identical.

* * * * *